(12) United States Patent
Kim et al.

(10) Patent No.: US 9,614,084 B1
(45) Date of Patent: Apr. 4, 2017

(54) SEMICONDUCTOR DEVICE AND METHOD FOR FABRICATING THE SAME

(71) Applicant: SK hynix Inc., Gyeonggi-do (KR)

(72) Inventors: Oh-Hyun Kim, Gyeonggi-do (KR);
Seung-Beom Baek, Gyeonggi-do (KR);
Tae-Hang Ahn, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/204,476

(22) Filed: Jul. 7, 2016

(30) Foreign Application Priority Data

Dec. 23, 2015 (KR) ........................ 10-2015-0185127

(51) Int. Cl.
| | | |
|---|---|---|
| *H01L 29/76* | (2006.01) | |
| *H01L 29/78* | (2006.01) | |
| *H01L 29/08* | (2006.01) | |
| *H01L 29/24* | (2006.01) | |
| *H01L 29/267* | (2006.01) | |
| *H01L 29/66* | (2006.01) | |

(52) U.S. Cl.
CPC ...... *H01L 29/7848* (2013.01); *H01L 29/0847* (2013.01); *H01L 29/24* (2013.01); *H01L 29/267* (2013.01); *H01L 29/66636* (2013.01)

(58) Field of Classification Search
CPC ............. H01L 29/7848; H01L 29/0847; H01L 29/66636; H01L 29/267; H01L 29/24
See application file for complete search history.

(56) References Cited

U.S. PATENT DOCUMENTS

| | | | |
|---|---|---|---|
| 7,588,980 B2 | 9/2009 | Kim et al. | |
| 8,278,179 B2* | 10/2012 | Lin | ................... H01L 21/82382 257/E21.431 |
| 2014/0084369 A1 | 3/2014 | Murthy et al. | |
| 2014/0106547 A1 | 4/2014 | Ye et al. | |

\* cited by examiner

*Primary Examiner* — Roy Potter
*Assistant Examiner* — Paul Patton
(74) *Attorney, Agent, or Firm* — I P & T Group LLP

(57) ABSTRACT

A semiconductor device includes a substrate comprising a channel region and a recess, wherein the recess is located at both side of the channel region; a gate structure formed over the channel region; a first SiP layer covering bottom corners of the gate structure and the recess; and a second SiP layer formed over the first SiP layer and in the recess, wherein the second SiP layer has a phosphorus concentration higher than that of the first SiP layer.

10 Claims, 7 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2015-0185127, filed on Dec. 23, 2015, which is herein incorporated by reference in its entirety.

BACKGROUND

1. Field

Exemplary embodiments of the present invention relate to a method for a semiconductor device, and more particularly, to a semiconductor device including an epitaxial layer and a fabrication method thereof.

2. Description of the Related Art

An integrated circuit (ICs) includes a transistor such as MOSFET. As the integrated circuit is scaled down, it is difficult to maintain or improve performance of the transistor. One of methods for improving performance of a transistor is to apply stress to a channel region of the transistor.

When suitable stress is applied to a channel region of a transistor, mobility of carriers in the channel region increases. When compressive stress is applied to a channel region of a PMOS transistor, mobility of holes in the channel region increases. In addition, when tensile stress is applied to a channel region of an NMOS transistor, mobility of electrons in the channel region increases.

SUMMARY

Embodiments of the present invention are directed to a transistor whose carrier mobility can be increased and to a fabrication method thereof.

Embodiments of the present invention are also directed to a semiconductor device having improved performance and a fabrication method thereof.

In accordance with an embodiment of the present invention, a method for fabricating a semiconductor device may include: forming a gate structure on a substrate; patterning the substrate using the gate structure as a mask to form a recess in the substrate; forming a buffer layer covering bottom corners of the gate structure and an inner surface of the recess; and forming a stress-inducing layer over the buffer layer and in the recess. The buffer layer and the stress-inducing layer may be formed by selective epitaxial growth. Each of the buffer layer and the stress-inducing layer may include a material doped with an N-type dopant, and the buffer layer has a dopant concentration lower than that of the stress-inducing layer. The buffer layer may include a dislocation-free material. The stress-inducing layer may include a material doped with N-type dopant, and the buffer layer may include a material undoped with the N-type dopant. The forming of the gate structure may include forming a gate stack over the substrate; forming a gate spacer on both sidewalls of the gate stack, and the gate spacer may include Nitride-Oxide-Nitride structure.

In accordance with another embodiment of the present invention, a method for fabricating a semiconductor device may include: forming a gate structure on a substrate; patterning the substrate using the gate structure as a mask to form a recess in the substrate; forming a first SiP layer covering bottom corners of the gate structure and a bottom and side walls of the recess; and forming a second SiP layer over the first SiP layer and in the recess, the second SiP layer has a phosphorus concentration higher than that of the first SiP layer. The second SiP layer may be formed to have a high phosphorus concentration so that it has dislocation, and the first SiP layer may be formed to have a low phosphorus concentration so that it is free of dislocations. The second SiP layer may have a phosphorus concentration equal to or higher than $1 \times 10^{21}$ atoms/cm$^3$. The first SiP layer may have a phosphorus concentration equal to or lower than $5 \times 10^{20}$ atoms/cm$^3$. The first SiP layer and the second SiP layer may be formed by selective epitaxial growth. The forming of the first SiP layer may be performed using a first silicon-containing precursor, the first silicon-containing precursor may include dichlorosilane, the forming of the second SiP layer may be performed using a second silicon-containing precursor, and the second silicon-containing precursor may include a mixture of dichlorosilane and silane. The forming of the first SiP layer may further include performing an in situ doping using PH$_3$, and the forming of the second SiP layer may further include performing an in situ doping using PH$_3$. The forming of the second SiP layer may be performed using dichlorosilane, silane, HCl, and PH$_3$.

In accordance with still another embodiment of the present invention, a method for fabricating a semiconductor device may include: forming a gate structure on a substrate; patterning the substrate using the gate structure as a mask to form a recess in the substrate; forming an undoped Si layer covering bottom corners of the gate structure and a bottom and sidewalls of the recess; and forming a SiP layer over the undoped Si layer and in the recess. The SiP layer may be formed to have a high phosphorus concentration so that it has dislocations. The SiP layer may have a phosphorus concentration equal to higher than $1 \times 10^{21}$ atoms/cm$^3$. Each of the undoped Si layer and the SiP layer may be formed by selective epitaxial growth. The forming of the undoped Si layer may be performed using a first silicon-containing precursor, the first silicon-containing precursor may include dichlorosilane, the forming of the SiP layer may be performed using a second silicon-containing precursor, and the second silicon-containing precursor may include a mixture of dichlorosilane and silane. The forming of the SiP layer may further include performing in situ doping using PH$_3$. The forming of the second SiP layer may be performed using dichlorosilane, silane, HCl, and PH$_3$.

In still accordance with yet another embodiment of the present invention, a method for fabricating a semiconductor device may include: forming a gate structure on a substrate; patterning the substrate using the gate structure as a mask to form a recess in the substrate; forming a SiP layer filling the recess and covering bottom corners of the gate structure; recessing the SiP layer to expose the bottom corners of the gate structure; and forming an undoped Si cap layer over the recessed SiP layer. The SiP layer may have a phosphorus concentration equal to or higher than $1 \times 10^{21}$ atoms/cm$^3$. Each of the SiP layer and the undoped Si cap layer may be formed by selective epitaxial growth. The forming of the SiP layer may be performed using a first silicon-containing precursor, the first silicon-containing precursor may include a mixture of dichlorosilane and silane, the forming of the undoped Si cap layer may be performed using a second silicon-containing precursor, and the second silicon-containing precursor may include dichlorosilane. The forming of the SiP layer may further include performing in situ doping using PH$_3$. The forming of the second SiP layer may be performed using dichlorosilane, silane, HCl, and PH$_3$.

In accordance with still another embodiment of the present invention, a semiconductor device may include: a substrate comprising a channel region and a recess, the recess is located at both side of the channel region; a gate structure formed over the channel region; a first SiP layer covering bottom corners of the gate structure and the recess; and a second SiP layer formed over the first SiP layer and in the recess, the second SiP layer may have a phosphorus concentration higher than that of the first SiP layer. The second SiP layer may have a high phosphorus concentration so that it has dislocations, and the first SiP layer may have a low phosphorus concentration so that it is free-dislocations. The first SiP layer may have a phosphorus concentration equal to or lower than $5 \times 10^{20}$ atoms/cm$^3$. The second SiP layer may have a phosphorus concentration equal to or higher than $1 \times 10^{21}$ atoms/cm$^3$.

In accordance with still another embodiment of the present invention, a semiconductor device may include: a substrate comprising a channel region and a recess, the recess is located at both sides of the channel region; a gate structure formed over the channel region; an undoped Si layer covering bottom corners of the gate structure and the recess; and a SiP layer formed over the undoped Si layer and in the recess, the SiP layer and the bottom corners of the gate structure are spaced apart from each by the undoped Si layer. The SiP layer may have a high phosphorus concentration so that it has dislocations. The SiP layer may have a phosphorus concentration equal to or higher than $1 \times 10^{21}$ atoms/cm$^3$.

In accordance with still another embodiment of the present invention, a semiconductor device may include: a substrate comprising a channel region and a recess, the recess is located at both sides of the channel region; a gate structure formed over the channel region; a SiP layer formed in the recess, an upper surface of the SiP layer is located at a lower level than bottom corners of the gate structure; and an undoped Si cap layer formed over the SiP layer. The SiP layer may have a high phosphorus concentration so that it has dislocations. The SiP layer may have a phosphorus concentration equal to or higher than $1 \times 10^{21}$ atoms/cm$^3$.

DETAILED DESCRIPTION

Figure 1A:
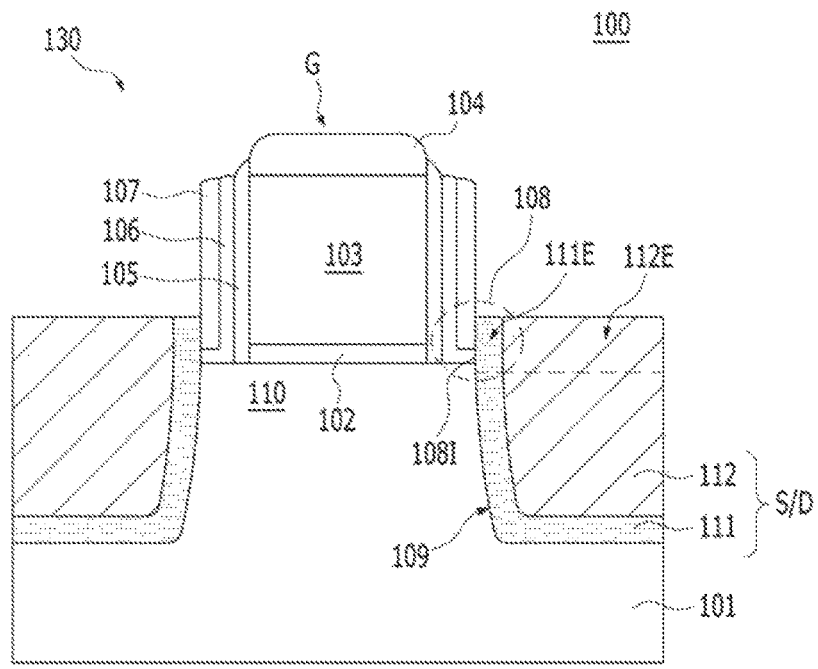
FIG. 1A illustrates a semiconductor device according to a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case in which the first layer is formed directly on the second layer or the substrate but also a case in which a third layer exists between the first layer and the second layer or the substrate.

In embodiments below, a description will be given for structures and methods for removing misfit and threading dislocations that occur at a Silicon Phosphorus (SiP)/Silicon oxide (SiO$_2$) interface. The SiP may include highly phosphorus-doped Silicon epitaxial layer. The SiP has a phosphorus concentration equal to or higher than $1 \times 10^{21}$ atoms/cm$^3$. For example, the phosphorus concentration of the SiP is in a rage from $1 \times 10^{21}$ atoms/cm$^3$ to $5 \times 10^{21}$ atoms/cm$^3$.

FIG. 1A illustrates a semiconductor device according to a first embodiment of the present invention. Referring to FIG. 1A, a semiconductor device 100 according to the first embodiment may include a transistor 130. The transistor 130 may include a gate structure G and source/drain regions S/D. It may further include a channel region 110 under the gate structure G. The transistor 130 may be NMOSFET.

The transistor 130 may be formed in a substrate 101. The substrate 101 may be made of a material suitable for semiconductor processing. The substrate 101 may include a semiconductor substrate. The substrate 101 may be made of a silicon-containing material. The substrate 101 may include silicon, single-crystalline silicon, polysilicon, amorphous silicon, silicon germanium, single-crystalline silicon germanium, polycrystalline silicon germanium, carbon-doped silicon, a combination of two or more thereof, or a multilayer of two or more thereof. The substrate 101 may also include other semiconductor material such as germanium. The substrate 101 may also include a group III/V semiconductor substrate, for example, a compound semiconductor substrate such as GaAs. The substrate 101 may include a Silicon-On-Insulator (SOI) substrate.

On the substrate 101, a gate structure G may be formed. The gate structure G may include a gate insulating layer 102, a gate electrode 103 and a gate cap layer 104. The gate insulating layer 102 may include silicon oxide, silicon nitride, silicon oxynitride, high-k material, or a combination of two or more thereof. The high-k material may include a material having a dielectric constant greater than that of silicon oxide. For example, the high-k material may include a material having a dielectric constant greater than 3.9. In other examples, the high-k material may include a material having a dielectric constant greater than 10. In another example, the high-k material may include a material having a dielectric constant of 10-30. The high-k material may include at least one metallic element. The high-k material may include a hafnium-containing material. The hafnium-containing material may include hafnium oxide, hafnium silicon oxide, hafnium silicon oxynitride, or a combination of two or more thereof. In another embodiment, the high-k material may include lanthanum oxide, lanthanum aluminum oxide, zirconium oxide, zirconium silicon oxide, zirconium silicon oxynitride, aluminum oxide, or a combination of two or more thereof. As the high-k material, any known high-k material may also be optionally used.

In some embodiments, the gate insulating layer 102 may be formed of a stack of an interfacial layer and a high-k material layer. The gate electrode 103 may be formed of a silicon-based material, a metal-based material, or a combination thereof. In this embodiment, the gate electrode 103 may be a metal-containing layer. The gate electrode 103 may include titanium nitride, tungsten, or a combination thereof. The gate electrode 103 may be formed of a metal material having a work function. The gate cap layer 104 may be formed of a dielectric material. The gate cap layer 104 may include silicon oxide, silicon nitride, or a combination thereof.

The gate structure G may further include a gate spacer. The gate spacer may be a multilayer structure. The gate spacer may include a first spacer 105, a second spacer 106 and a third spacer 107. The first spacer 105 and the third spacer 107 may be formed of the same material. The second spacer 106 may be formed of a material different from that of the first and third spacers 105 and 107. The first spacer 105 and the third spacer 107 may be formed of silicon nitride, and the second spacer 106 may be formed of silicon oxide. The gate spacer may have an Nitride-Oxide-Nitride (NON) structure. The NON structure is advantageous to control proximity between the source/drain regions S/D and the gate structure G.

The source/drain regions S/D may be formed in recesses 109 and may be epitaxially grown. The recesses 109 may be formed in the substrate 101 under both sides of the gate structure G. The recesses 109 may be formed at the end portions of the channel region 110. Each of the source/drain regions S/D may include a first SiP layer 111 and a second SiP layer 112. The first SiP layer 111 may line a bottom and sidewalls of the recesses 109. An end portion 111E of the first SiP layer 111 may cover the bottom corners 108 of the gate structure G. The second SiP layer 112 may be formed on the first SiP layer 111 so as to completely fill the recess 109. A top portion 112E of the second SiP layer 112 may be located at substantially the same level as the bottom corners 108 of the gate structure G. The first SiP layer 111 and the second SiP layer 112 may be epitaxial layers. The first SiP layer 111 and the second SiP layer 112 may be formed by selective epitaxial growth (SEG). The first SiP layer 111 and the second SiP layer 112 may apply stress to the channel region 110. For example, the first SiP layer 111 and the second SiP layer 112 may apply tensile stress to the channel region 110. This tensile stress can increase mobility of carriers in the channel region 110.

The first SiP layer 111 and the second SiP layer 112 may have different phosphorus concentrations. The first SiP layer 111 may have a relatively low phosphorus concentration, and the second SiP layer 112 may have a relatively high phosphorus concentration. The first SiP layer 111 may have a phosphorus concentration of $5 \times 10^{20}$ atoms/cm$^3$ or less. For example, the phosphorus concentration of the first SiP layer 111 is in rage from $1 \times 10^{19}$ atoms/cm$^3$ to $5 \times 10^{20}$ atoms/cm$^3$. The second SiP layer 112 may have a phosphorus concentration of $1 \times 10^{21}$ atoms/cm$^3$ or more. For example, the phosphorus concentration of the second SiP layer 112 is in rage from $1 \times 10^{21}$ atoms/cm$^3$ to $5 \times 10^{21}$ atoms/cm$^3$. The second SiP layer 112 may include threading dislocation due to its high phosphorus concentration. In contrast, the first SiP layer 111 may not include threading dislocation due to its low phosphorus concentration. Threading dislocation may be induced by precipitation of phosphorus.

Between the first SiP layer 111 and the bottom corners 108 of the gate structure G, a SiP/SiO$_2$ interface 108I may be formed. For example, the second spacer 106 comes into contact with the first SiP layer 111 to form the SiP/SO$_2$ interface 108I.

As described above, since the second SiP layer 112, which has a relatively high phosphorus concentration, is not in contact with the bottom cornmer 108 of the gate structure G, a threading dislocation or a defect does not occur at the gate corner 108 of the gate structure G. Rather, the first SiP layer 111, which has a relatively low phosphorus concentration, is in contact with the bottom corner 108 of the gate structure G to form the SiP/SiO$_2$ interface 118I.

Figure 1B:
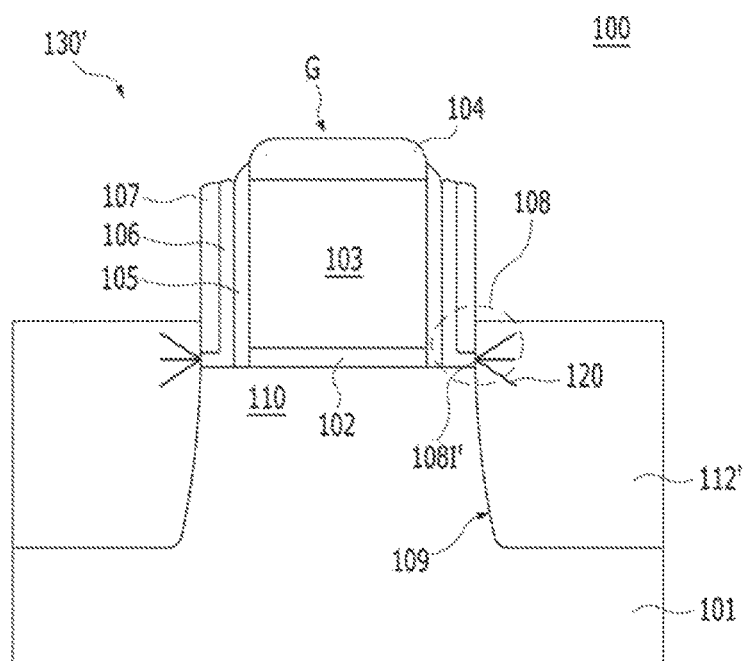
FIG. 1B illustrates a transistor according to a comparative example.

FIG. 1B illustrates a transistor including source/drain regions made only of a SiP layer having a high phosphorus concentration. Referring to FIG. 1B, a transistor 130' may include source/drain regions made only of a SiP layer 112' having a high phosphorus concentration. As the SiP layer 112' having a high phosphorus concentration comes into a direct contact with the bottom corner 108 of the gate structure G, a SiP/SiO$_2$ interface 108I' is produced. When the SiP/SiO$_2$ interface 108I' is produced by the SiP layer 112' which has a high phosphorus concentration as described above, defects 120 can be caused by the precipitation of phosphorus. Thus, a threading dislocation may occur at the bottom corners 108 of the gate structure G due to the precipitation of phosphorus.

Figure 2A:
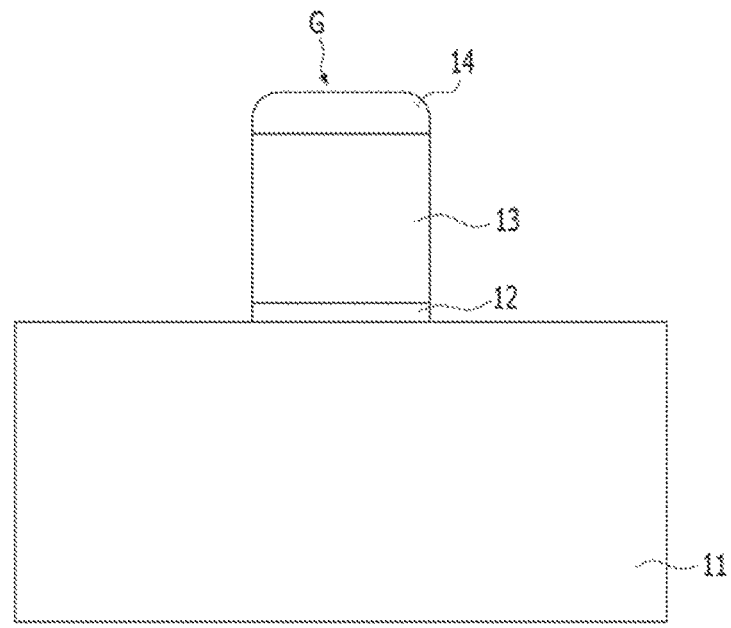
FIGS. 2A to 2E illustrate a method for fabricating the semiconductor device according to the first embodiment of the present invention.

FIGS. 2A to 2E illustrate an example of a method for fabricating the semiconductor device according to the first embodiment. As shown in FIG. 2A, a substrate 11 may be prepared. The substrate 11 may include a silicon substrate. Although not shown in the figures, an element isolating layer may further be formed on the substrate 11.

A gate stack may be formed on the substrate 11. The gate stack may include a gate insulating layer 12, a gate electrode 13 and a gate cap layer 14. The gate insulating layer 12 may include silicon oxide, silicon nitride, silicon oxynitride, high-k material, or a combination of two or more thereof. In some embodiments, the gate insulating layer 12 may be formed of a stack of an interfacial layer and a high-k material. The gate electrode 13 may be formed of a silicon-based material, a metal-based material or a combination thereof. In this embodiment, the gate electrode 13 may be a metal-containing layer. The gate electrode 13 may include titanium nitride, tungsten or a combination thereof.

The gate electrode 13 may be made of a metal material having a work function. The gate electrode 13 may have an N-type work function or a P-type work function. To form a NMOSFET, the gate electrode 13 may have an N-type work function. To form a PMOSFET, the gate electrode 13 may have a P-type work function. For work function engineering, various work function materials may be formed.

The gate cap layer 14 may be formed of a dielectric material. The gate cap layer 14 may include silicon oxide, silicon nitride or a combination thereof. The gate cap layer 14 may be used as an etch barrier during a gate photolithography process.

Figure 2B:
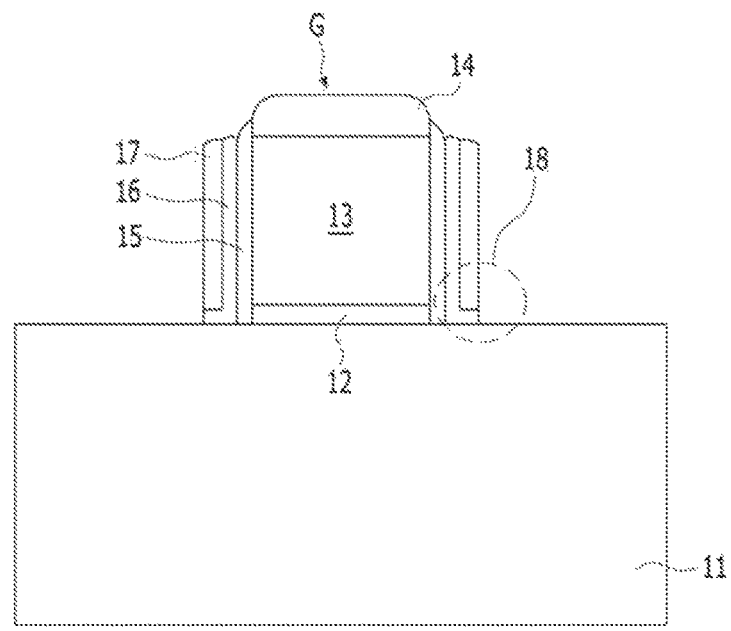

As shown in FIG. 2B, a gate spacer may be formed on both sidewalls of the gate stack. The gate spacer may be formed of a dielectric material. The gate spacer may include silicon oxide, silicon nitride or a combination thereof. The gate spacer may have a multilayer structure. In this embodiment, the gate spacer may include a first spacer 15, a second spacer 16 and a third spacer 17. The first spacer 15 and the third spacer 17 may be formed of the same material. The second spacer 16 may be formed of a material different from that of the first and third spacers 15 and 17. The first spacer 15 and the third spacer 17 may be formed of silicon nitride, and the second spacer 16 may be formed of silicon oxide.

Formation of the gate spacer may include blanket etching of the spacer layers. On the top and sidewalls of the gate stack, the spacer layers may be formed, followed by an etch-back process. In other embodiments, the first spacer 15 may be first formed, and subsequently, the second spacer 16 and the third spacer 17 may be formed. The third spacer 17 may not be in contact with the surface of the substrate 11. The bottom of each of the first spacer 15 and the second spacer 16 may be in contact with the surface of the substrate 11.

As described above, the gate spacer may have an Nitride-Oxide-Nitride (NON) structure. The NON structure is advantageous to control the proximity between the epitaxially grown source/drain regions S/D and the gate structure G. The proximity is an important factor on which electrical properties depend. A thickness of the gate spacer is controlled for control of the proximity. In other words, it is very important to control a thickness of the gate spacer.

Through a recess etching process which is performed before epitaxial growth, the thickness of the gate spacer becomes significantly thinner, making it difficult to control the thickness. To address this issue, the second spacer 16 is covered on the first spacer 15, and the third spacer 17 is covered thereon to ensure a sufficient thickness of NON. Thus, the proximity between the epitaxially grown source/drain regions S/D and the gate structure G can be controlled. In this case, the controllability of the proximity can increase. Then, the first and second SiP layers having the well-controlled proximity are epitaxially grown. In other embodiments, a sacrificial oxide spacer may be covered on a first nitride spacer, and a second nitride spacer may be covered thereon. Next, when the sacrificial oxide spacer and the second nitride spacer are removed by a process of removing the sacrificial oxide spacer, the first nitride spacer having a thin thickness will finally remain. Nevertheless, a well-controlled proximity can be obtained.

Through such a series of processes, a gate structure G including the gate stack and the gate spacer may be formed. The gate structure G may include bottom corners 18.

Figure 2C:
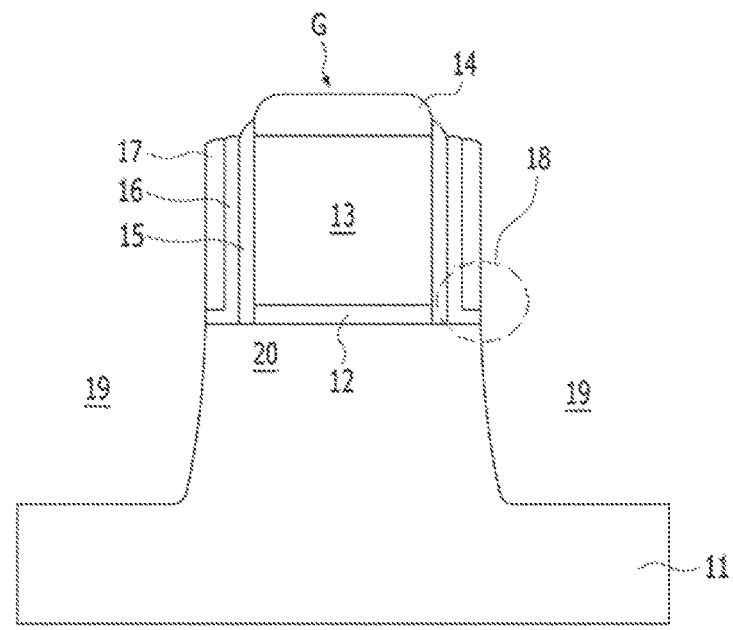

As shown in FIG. 2C, one or more recesses 19 may be formed in the substrate 11. To form the recesses 19, portions of the substrate 11 under both sides of the gate structure G may be etched out. The depth of the recesses 19 may vary depending on etching conditions. To form the recesses 19, dry etching, wet etching or a combination thereof may be performed. In other embodiments, the recess 19 may further include an undercut. The undercut may be located below the gate spacer. In other embodiments, the recess 19 may have a sigma shape. For example, an etchant such as potassium hydroxide (KOH) may be used to form the recess 19. The sidewall profile of the recess 19 may be vertical or inclined. By the recesses 19, a channel region 20 under the gate structure G may be defined.

Figure 2D:
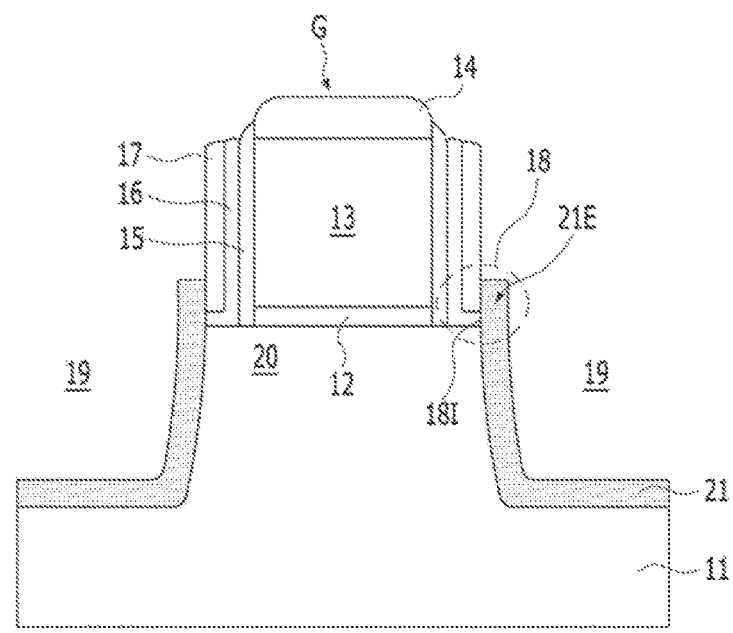

As shown in FIG. 2D, a first SiP layer 21 may be formed. The first SiP layer 21 may line a bottom and sidewalls of the recess 19. An end portion 21E of the first SiP layer 21 may overlap the bottom corners 18 of the gate structure G. The end portion 21E of the first SiP layer 21 may be in contact with the second spacer 16. Thus, a SiP/SiO$_2$ interface 18I may be formed between the end portion 21E of the first SiP layer 21 and the second spacer 16. The SiP/SiO$_2$ interface 18I may be formed at the bottom corners 18 of the gate structure G.

The first SiP layer 21 may be formed by CVD, LPCVD, ALD, UHVCVD, MBE or other suitable epitaxial process. The first SiP layer 21 may be formed by at least single epitaxial process. The first SiP layer 21 may be formed by selective epitaxial growth SEG. The first SiP layer 21 may have a low phosphorus concentration. The first SiP layer 21 may be a phosphorus-doped silicon layer.

The first SiP layer 21 may have a phosphorus concentration of $5 \times 10^{20}$ atoms/cm$^3$ or less. For example, the phosphorus concentration of the first SiP layer 21 is in rage from $1 \times 10^{19}$ atoms/cm$^3$ to $5 \times 10^{20}$ atoms/cm$^3$. Since the first SiP layer 21 has such a low phosphorus concentration, defects such as dislocations do not occur at the SiP/SiO$_2$ interface 18I due to the first SiP layer 21. In contrast, when the first SiP layer 21 has a high phosphorus concentration, defects can occur at the SiP/SiO$_2$ interface 18I. The defects can be caused by precipitation of phosphorus.

The first SiP layer 21 may be formed using a phosphorus-containing material and a silicon-containing material. Herein, the phosphorus-containing material and the silicon-containing material may be referred to as the phosphorus-containing precursor and the silicon-containing precursor, respectively. The phosphorus-containing precursor may include phosphine (PH$_3$). The silicon-containing precursor may include silane (SiH$_4$), disilane (Si$_2$H$_6$), trisilane (Si$_3$H$_8$), dichlorosilane (SiH$_2$Cl$_2$), or a combination of two or more thereof.

Formation of the first SiP layer 21 may include in situ doping. For example, during deposition of a silicon layer, in situ doping may be performed using phosphine (PH$_3$). As described above, the recesses 19 may be lined with the first SiP layer 21 having a low phosphorus concentration.

Figure 2E:
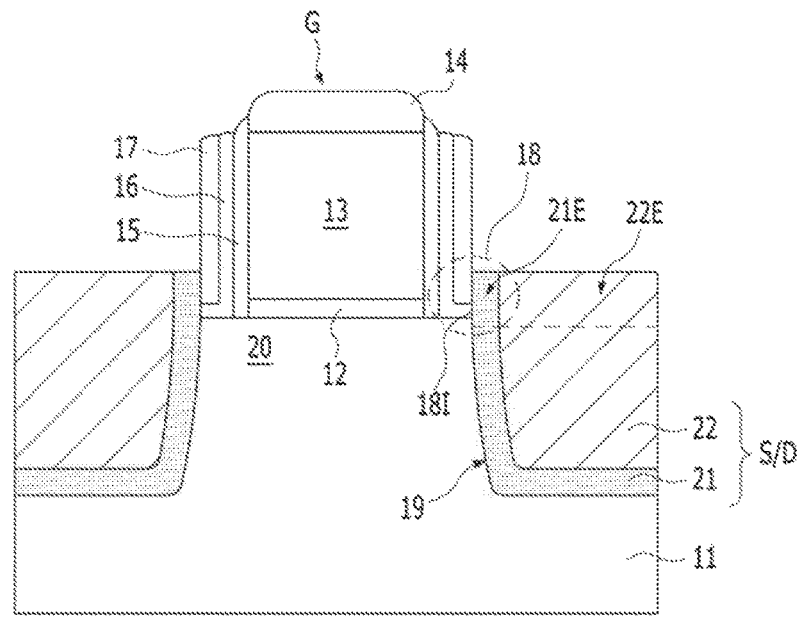

As shown in FIG. 2E, the recesses lined with the first SiP layer 21, that is, the lined recesses 19, may be filled with the second SiP layers 22. A top portion 22E of the second SiP layer 22 may overlap the bottom corners 18 of the gate structure G. The top portion 22E of the second SiP layer 22 may not be in direct contact with the SiP/SiO$_2$ interface 18I. For example, the end portion 21E of the first SiP layer 21 may be located between the top portion 22E of the second SiP layer 22 and the SiP/SiO$_2$ interface 18I.

The second SiP layer 22 may be formed by CVD, LPCVD, ALD, UHVCVD, MBE or other suitable epitaxial process. The second SiP layer 22 may be formed by at least single epitaxial process. The second SiP layer 22 may be formed by selective epitaxial growth (SEG). The second SiP layer 22 may have a high phosphorus concentration. The second SiP layer 22 may be a phosphorus-doped silicon layer. The second SiP layer 22 may have a phosphorus concentration of $1 \times 10^{21}$ atoms/cm$^3$ or higher. For example, the phosphorus concentration of the second SiP layer 22 is in rage from $1 \times 10^2$ atoms/cm$^3$ to $5 \times 10^{21}$ atoms/cm$^3$. Even though the second SiP layer 22 which has such a high phosphorus concentration, no defect occurs at the bottom corners 18 of the gate structure G. For example, because the first SiP layer 21 is provided between the second SiP layer 22 and the SiP/SiO$_2$ interface 18I, no defect occurs at the bottom corners 18 of the gate structure G.

The second SiP layer 22 may be formed using a phosphorus-containing material and a silicon-containing material. To form the second SiP layer 22, chlorine-containing gas may further be used. The chlorine-containing gas may include HCl. Herein, the phosphorus-containing material and the silicon-containing material may be referred to as the phosphorus-containing precursor and the silicon-containing precursor, respectively. The phosphorus-containing precursor may include phosphine (PH$_3$). The silicon-containing precursor may include silane (SiH$_4$), disilane (Si$_2$H$_6$), trisilane (Si$_3$H$_8$), dichlorosilane (SiH$_2$Cl$_2$), or a combination of two or more thereof. In this embodiment, to form a second SiP layer 22 having a phosphorus concentration equal to or higher than $1 \times 10^{21}$ atoms/cm$^3$, a mixture of dichlorosilane (SiH$_2$Cl$_2$) and silane (SiH$_4$) may be used to form the second SiP layer 22. Formation of a SiP layer having a phosphorus concentration equal to or higher than $1\times10^{21}$ atoms/cm$^3$ on a bare wafer can be achieved by controlling temperature, pressure and a flow rate of the phosphorus-containing precursor. However, when a dielectric material such as the gate spacer is present, it will be difficult to ensure a selectivity of the second SiP layer 22 having a high phosphorus concentration with respect to the dielectric material during formation of the second SiP layer 22. When conditions are controlled to ensure the selectivity, a growth rate of the second SiP layer 22 can be reduced, and the phosphorus concentration thereof can also be lowered.

Thus, in the embodiments of the present invention, the silicon-containing precursor is controlled as follows in order to quickly form the second SiP layer 22 having a high phosphorus concentration while ensuring the selectivity of the second SiP layer 22 with respect to the gate spacer. For example, epitaxial growth may be performed using a mixture of dichlorosilane and silane instead of using dichlorosilane alone. Thus, the growth rate can be increased by an acceleration of adsorption together with a removal of a chlorine (Cl) functional group from the epitaxially grown surface while the phosphorus concentration can increase. Accordingly, a window for ensuring the selectivity by HCl can increase. As a result, a process can be secured which satisfies an increased doping level, an increased growth rate, and selectivity and defect-free conditions.

Formation of the second SiP layer 22 may include in situ doping. For example, during deposition of a silicon layer, in situ doping may be performed using phosphine (PH$_3$).

As described above, the recesses 19 may be filled with the first SiP layer 21 having a relatively low phosphorus concentration and the second SiP layer 22 having a relatively high phosphorus concentration. The first SiP layer 21 and the second SiP layer 22, in combination, may serve as a source/drain region S/D. The source/drain region S/D is also referred to as an embedded source/drain region.

The first SiP layer 21 and the second SiP layer 22 may also be referred to as stress-inducing materials. These layers can apply stress to the channel region 20. For example, the first SiP layer 21 and the second SiP layer 22 can apply a tensile stress to the channel region 20. The tensile stress applied can increase mobility of carriers in the channel region 20. Since the second SiP layer 22 has a high phosphorus concentration, it can further increase the mobility of carriers. In addition, since the second SiP layer 22 has a high phosphorus concentration, it can reduce a contact resistance. For example, when a contact material such as silicide is formed on the second SiP layer 22, the second SiP layer 22 can reduce the contact resistance.

As described above, the first SiP layer 21 and the second SiP layer 22 may have different phosphorus concentrations from each other. Both the first SiP layer 21 and the second SiP layer 22 include phosphorus, but the phosphorus concentration of the first SiP layer 21 may be lower than that of the second SiP layer 22. When the second SiP layer 22 comes in direct contact with the bottom corners 18 of the gate structure G, defects can be caused by precipitation of phosphorus. According to this embodiment, however, defects can be suppressed since the first SiP layer 21 is located between the SiP/SiO$_2$ interface 18I and the second SiP layer 22. For example, defects such as threading dislocations and misfits can be suppressed. When the phosphorus concentration of the first SiP layer 21 is maintained at $5\times10^{20}$ atoms/cm$^3$ or lower, the precipitation of phosphorus at the bottom corners 18 of the gate structure G can be suppressed, and thus the formation of defects can be suppressed.

In this embodiment, the first SiP layer 21 and the second SiP layer 22 may be carbon-free SiP layers. Carbon reduces a quality of a SiP layer. When a concentration of carbon in the SiP layer increases, a tensile stress applied by the SiP layer is limited. Thus, carbon-containing SiP layers have a limited ability to improve mobility of carriers. When carbon-free SiP layers are formed, the mobility of carriers can further be improved, and the quality of the layers can be improved.

In other embodiments, the first SiP layer 21 and the second SiP layer 22 may be formed in situ. For example, the first SiP layer 21 may be formed by reducing the flow rate of PH$_3$ during a first period ranging from an initial stage of epitaxial growth of the silicon layer to a time point at which the silicon layer reaches a certain thickness. Next, the second SiP layer 22 may be formed by increasing the flow rate of PH$_3$ until epitaxial growth of the silicon layer is completed to obtain a desired thickness.

Figure 3:
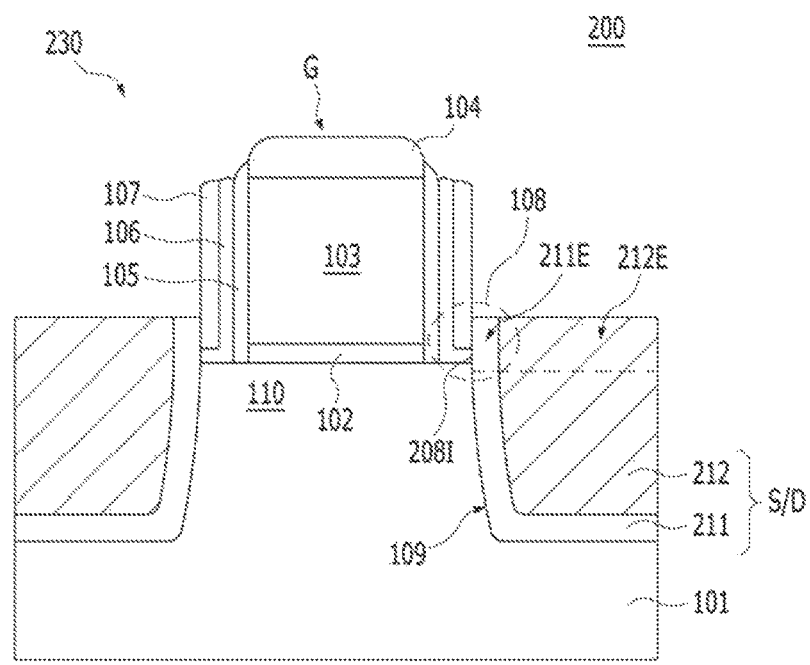
FIG. 3 illustrates a semiconductor device according to a second embodiment of the present invention.

FIG. 3 illustrates a semiconductor device according to a second embodiment of the present invention. A portion of a semiconductor device 200 according to the second embodiment may be similar to that of the semiconductor device 100 of the first embodiment. The semiconductor device 200 may include a transistor 230. Referring to FIG. 3, the transistor 230 may include a gate structure G and source/drain regions S/D. It may further include a channel region 110 under the gate structure G. The transistor 230 may be NMOSFET.

The source/drain regions S/D may fill recesses 109. The source/drain regions S/D may include a Si layer 211 and a SiP layer 212. The Si layer 211 may line a bottom and a sidewall of each of the recesses 109. The end portion 211E of the Si layer 211 may cover the bottom corners 108 of the gate structure G. The SiP layer 212 may be formed on the Si layer 211 to completely fill the recess 109. The top portion of the SiP layer 212 may overlap the bottom corners 108 of the gate structure G.

The Si layer 211 and the SiP layer 212 may be epitaxial layers.

The Si layer 211 and the SiP layer 212 may be layers formed by selective epitaxial growth (SEG). The Si layer 211 and the SiP layer 212 can apply stress to the channel region 110. For example, the Si layer 211 and the SiP layer 212 can apply tensile stress to the channel region 110. Thus, mobility of carriers in the channel region 110 can be increased.

Unlike the first SiP layer 111 in the first embodiment, the Si layer 211 may be undoped. That is, the Si layer 211 is undoped with phosphorus. The Si layer 211 may be carbon-free. The Si layer 211 may be formed using a silicon-containing precursor. The silicon-containing precursor may include silane (SiH$_4$), disilane (Si$_2$H$_6$), trisilane (Si$_3$H$_8$), dichlorosilane (SiH$_2$Cl$_2$), or a combination of two or more thereof. During formation of the Si layer 211, doping with PH$_3$ may be omitted.

Formation of the SiP layer 212 may include in situ doping. The undoped Si layer 211 and the SiP layer 212 may be formed in situ. Like the second SiP layer 112 in the first embodiment, the SiP layer 212 may have a phosphorus concentration equal to or higher than $1\times10^{21}$ atoms/cm$^3$. For example, the phosphorus concentration of the SiP layer 212 is in rage from $1\times10^{21}$ atoms/cm$^3$ to $5\times10^{21}$ atoms/cm$^3$.

As the Si layer 211 is formed as described above, a Si/SiO$_2$ interface 208I is formed at the bottom corners 108 of the gate structure G. Namely, a SiP/SiO$_2$ interface is not formed. Thus, the formation of defects is suppressed.

Figure 4:
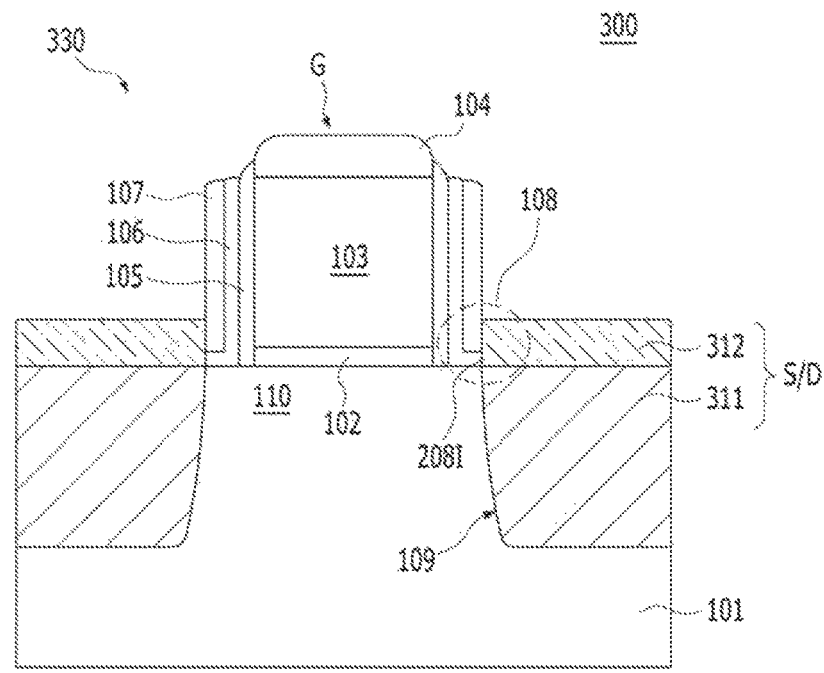
FIG. 4 illustrates a semiconductor device according to a third embodiment of the present invention.

FIG. 4 illustrates a semiconductor device according to as third embodiment of the present invention. A portion of a semiconductor device 300 according to the third embodiment may be similar to that of the semiconductor device 100 of the first embodiment. Referring to FIG. 4, the semiconductor device according to the third embodiment may include a transistor 330. The transistor 330 may include a gate structure G and source/drain regions S/D. It may further include a channel region 110 under the gate structure G. The transistor 330 may be NMOSFET.

The source/drain regions S/D may fill recesses 109. The source/drain regions S/D may include a SiP layer 311 and an undoped Si cap layer 312. The SiP layer 311 may be formed to completely fill the recesses 109. A top portion of the SiP layer 311 may be located at a lower level than the bottom corners 108 of the gate structure G so that the SiP layer 311 does not overlap the bottom corners 108 of the gate structure G or a gate spacer 105/106/107. The undoped Si cap layer 312 may be in contact with the bottom corners 108 of the gate structure G.

The SiP layer 311 and the undoped Si cap layer 312 may be epitaxial layers. The SiP layer 311 and the undoped Si cap layer 312 may be layers formed by selective epitaxial growth (SEG). The SiP layer 311 can apply stress to the channel region 110. For example, the SiP layer 311 can apply tensile stress to the channel region 110. Thus, mobility of carriers in the channel region 310 can be increased.

The undoped Si cap layer 312 may be undoped. Namely, it may be undoped with phosphorus. The undoped Si cap layer 312 may be carbon-free. Like the second SiP layer 112 in the first embodiment, the SiP layer 311 may have a phosphorus concentration equal to or higher than $1\times10^{21}$ atoms/cm$^3$. For example, the phosphorus concentration of the SiP layer 311 is in rage from $1\times10^{21}$ atoms/cm$^3$ to $5\times10^{21}$ atoms/cm$^3$.

As described above, since the SiP layer 311 is formed not to contact the bottom corners 108 of the gate structure G, a SiP/SiO$_2$ interface is not formed between the SiP layer 311 and the bottom corners 108. Thus, defect formation is suppressed. Between the undoped Si cap layer 312 and the bottom corners 108 of the gate structure G, a Si/SiO$_2$ interface 208I may be formed.

Figure 5A:
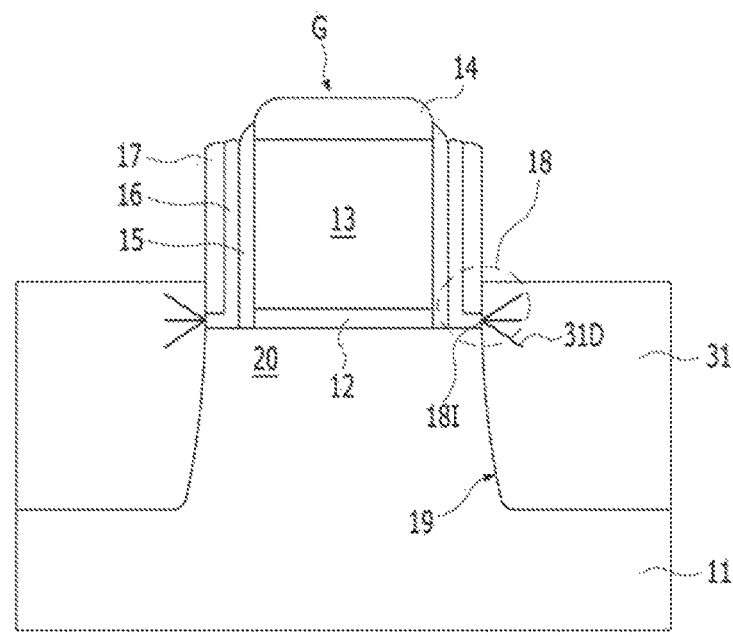
FIGS. 5A to 5C illustrate a method for fabricating the semiconductor device according to the third embodiment of the present invention.
Figure 5B:
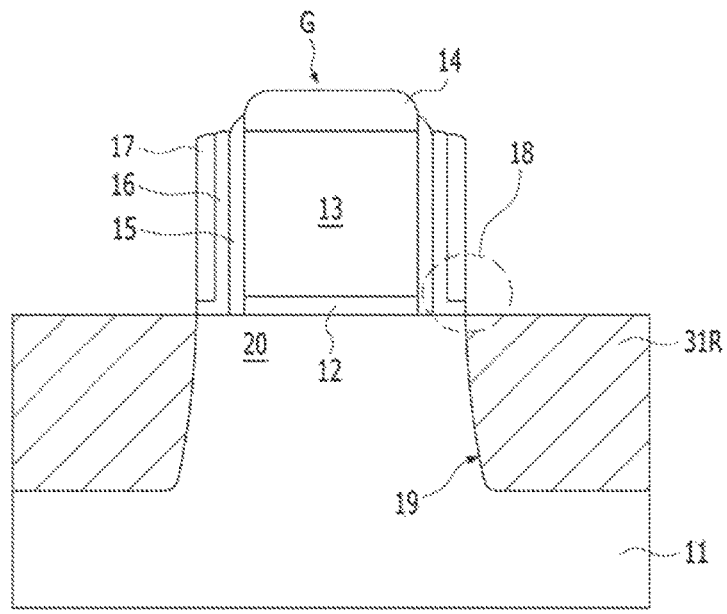
Figure 5C:
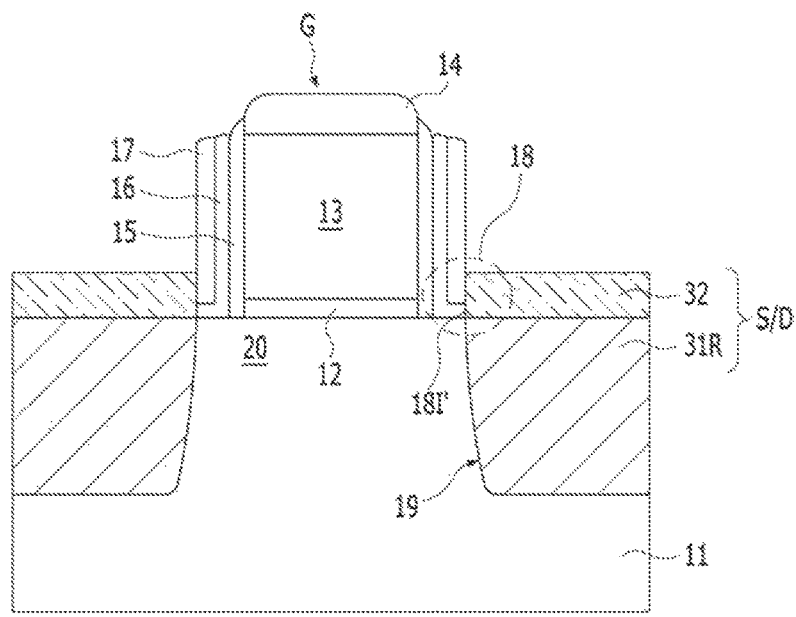

FIGS. 5A to 5C illustrate an example of a method for fabricating the semiconductor device according to third embodiment. First, according to the method shown in FIGS. 2A to 2C, a gate stack G, a gate spacer 15/16/17, and recesses 19 may be formed. Next, as shown in FIG. 5A, the recesses 19 may be filled with a SiP layer 31. The top portion of the SiP layer 31 may overlap the bottom corners 18 of the gate structure G. The top portion of the SiP layer 31 and the bottom corners 18 of the gate structure G may form a SiP/SiO$_2$ interface 18I.

The SiP layer 31 may be formed by CVD, LPCVD, ALD, UHVCVD, MBE or other suitable epitaxial process. The SiP layer 31 may be formed by at least single epitaxial process. The SiP layer 31 may have a high phosphorus concentration. The SiP layer 31 may be a phosphorus-doped silicon layer. The SiP layer 31 may have a phosphorus concentration equal to or higher than $1\times10^{21}$ atoms/cm$^3$. For example, the phosphorus concentration of the SiP layer 31 is in rage from $1\times10^{21}$ atoms/cm$^3$ to $5\times10^{2+}$ atoms/cm$^3$. Since the SiP layer 31 has such a high phosphorus concentration, defects 31D can occur at the SiP/SiO$_2$ interface 18I.

The SiP layer 31 may be formed using a phosphorus-containing material and a silicon-containing material. To form the SiP layer 31, HCl may further be used. Herein, the phosphorus-containing material and the silicon-containing material may be referred to as the phosphorus-containing precursor and the silicon-containing precursor, respectively. The phosphorus-containing precursor may include phosphine (PH$_3$). The silicon-containing precursor may include silane (SiH$_4$), disilane (Si$_2$H$_6$), trisilane (Si$_3$H$_8$), dichlorosilane (SiH$_2$Cl$_2$), or a combination of two or more thereof. In this embodiment, a mixture of dichlorosilane and silane may be used as the silicon-containing precursor to form the SiP layer 31 having a phosphorus concentration equal to or higher than $1\times10^{21}$ atoms/cm$^3$.

Formation of the SiP layer 31 may include in situ doping. For example, during deposition of a silicon layer, in situ doping may be performed using phosphine (PH$_3$). As described above, the recesses 19 may be filled with the SiP layer 31 having a high phosphorus concentration. The SiP layer 31 may provide a source/drain region.

As shown in FIG. 5B, defects 31D may be removed from the SiP layer 31. To remove the defects 31D, the SiP layer 31 may be recessed. Thus, the SiP/SiO$_2$ interface 18I and the defects 31D can be removed. To recess the SiP layer 31, an etch-back process may be performed. A top surface of the recessed SiP layer 31R is located at a lower level than the bottom corners 18 of the gate structure G. To remove the defects 31D, post etching may be performed. The post etching may be performed using chlorine-containing gas. The post etching may include etching with HCl. The post etching with HCl may be performed in situ after formation of the recessed SiP layer 31R.

As shown in FIG. 5C, an undoped Si cap layer 32 may be formed on the recessed SiP layer 31R and in the recess 19. The undoped Si cap layer 32 may come into contact with the bottom corners 18 of the gate structure G. The undoped Si cap layer 32 and the bottom corners 18 of the gate structure G may form a Si/SiO$_2$ interface 18I'.

The undoped Si cap layer 32 may be undoped with phosphorus. Thus, even though the Si/SiO$_2$ interface 18I' is formed between the undoped Si cap layer 32 and the bottom corners 18 of gate structure G, no defect occurs at the Si/SiO$_2$ interface 18I'.

According to the third embodiment, when etching with HCl is performed in situ in an epitaxial growth chamber after formation of the SiP layer 31 having a high phosphorus concentration, the defects 31D are removed. Since an etch rate of the defects 31D is higher than that of a crystalline material, the defects 31D that occurred at the SiP/SiO$_2$ interface 18I are removed. When the undoped Si cap layer 32 is capped by epitaxial growth after removal of the defects 31D, no problem arises even in a subsequent process for forming a contact. Thus the effect of removing the defects can also be obtained.

The transistors 130, 230 and 330 according to the embodiments of the present invention may be planar gate-type transistors. In another embodiment, the source/drain region S/D may be a FinFET. In addition, the gate structure G in each of the transistors 130, 230 and 330 may be formed by a gate-last process. Each of the transistors 130, 230 and 330 may be a portion of a CMOSFET.

Figure 6:
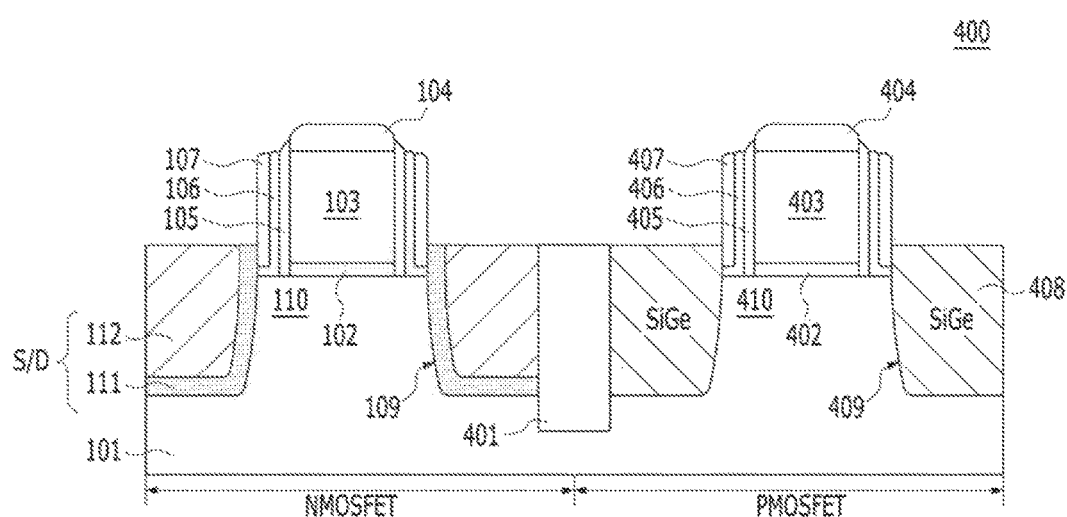
FIG. 6 shows a CMOSFET according to an embodiment of the present invention.

FIG. 6 illustrates a CMOSFET according to an embodiment of the present invention. Referring to FIG. 6, a CMOSFET 400 may include an NMOSFET and a PMOSFET. The NMOSFET and the PMOSFET may be isolated from each other by an isolating layer 401. The isolating layer 401 may be an STI region.

The NMOSFET may be the same transistor 130 as the first embodiment shown in FIG. 1A. The NMOSFET may include a gate structure and source/drain regions S/D. It may further include a channel region 110 under the gate structure. The gate structure may include a gate insulating layer 102, a gate electrode 103 and a gate cap layer 104. The gate structure may further include a gate spacer composed of a first spacer 105, a second spacer 106 and a third spacer 107. The source/drain regions S/D may include a first SiP layer 111 having a relatively low phosphorus concentration and a second SiP layer 112 having a relatively high phosphorus concentration.

The PMOSFET may include a gate structure and source/drain regions 408. It may further include a channel region 410 under the gate structure. The source/drain region 408 may include a stress-inducing material. The stress-inducing material may include silicon germanium (SiGe). The source/drain regions 408 may be filled in recesses 409. Thus, the source/drain regions 408 may be referred to as embedded SiGe. Compressive stress may be applied to the channel region 410 by the source/drain regions 408 made of SiGe. This can increase mobility of carriers in the channel region 410.

The gate structure may include a gate insulating layer 402, a gate electrode 403 and a gate cap layer 404. The gate structure may further include a gate spacer composed of a first spacer 405, a second spacer 406 and a third spacer 407. The gate structure of the PMOSFET may be the same as the gate structure of the NMOSFET.

As described above, according to the embodiments, mobility of carriers in the channel region can be increased by forming a SiP layer having a high phosphorus concentration, which serves as a stress-inducing material.

According to this embodiment, the magnitude of stress that is induced into the channel region can be increased by removing defects caused by the SiP layer having a high phosphorus concentration.

According to this embodiment, defects at the interface between the gate spacer including oxide and the SiP layer having a high phosphorus concentration can be removed.

According to the embodiments, using a mixture of dichlorosilane and silane, the SiP layer having a high phosphorus concentration can be epitaxially grown. In addition, the SiP layer obtained as such may have a high selectivity with respect to a dielectric material.

According to the embodiments, the driving current of a transistor can be increased by increasing the carrier mobility of the transistor.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a substrate comprising a channel region and a recess, wherein the recess is located at both side of the channel region;
   a gate structure formed over the channel region;
   a first SiP layer covering bottom corners of the gate structure and the recess; and
   a second SiP layer formed over the first SiP layer and in the recess,
   wherein the second SiP layer has a phosphorus concentration higher than that of the first SiP layer.

2. The semiconductor device of claim 1, wherein the second SiP layer has a high phosphorus concentration so that it has dislocations, and
   wherein the first SiP layer has a low phosphorus concentration so that it is free-dislocations.

3. The semiconductor device of claim 1, wherein the second SiP layer has a phosphorus concentration equal to or higher than $1 \times 10^{21}$ atoms/cm$^3$.

4. The semiconductor device of claim 1, wherein the first SiP layer has a phosphorus concentration equal to or lower than $5 \times 10^{20}$ atoms/cm$^3$.

5. A semiconductor device comprising:
   a substrate comprising a channel region and a recess, wherein the recess is located at both sides of the channel region;
   a gate structure formed over the channel region;
   an undoped Si layer covering bottom corners of the gate structure and the recess; and
   a SiP layer formed over the undoped Si layer and in the recess,
   wherein the SiP layer and the bottom corners of the gate structure are spaced apart from each by the undoped Si layer.

6. The semiconductor device of claim 5, wherein the SiP layer has a high phosphorus concentration so that it has dislocations.

7. The semiconductor device of claim 5, wherein the SiP layer has a phosphorus concentration equal to or higher than $1 \times 10^{21}$ atoms/cm$^3$.

8. A semiconductor device comprising:
   a substrate comprising a channel region and a recess, wherein the recess is located at both sides of the channel region;
   a gate structure formed over the channel region;
   a SiP layer formed in the recess, wherein an upper surface of the SiP layer is located at a lower level than bottom corners of the gate structure; and
   an undoped Si cap layer formed over the SiP layer so that the undoped Si cap layer extends over the bottom corners of the gate structure.

9. The semiconductor device of claim 8, wherein the SiP layer has a high phosphorus concentration so that it has dislocations.

10. The semiconductor device of claim 8, wherein the SiP layer has a phosphorus concentration equal to or higher than $1 \times 10^{21}$ atoms/cm$^3$.

* * * * *